(12) United States Patent
Allen et al.

(10) Patent No.: US 8,473,274 B1
(45) Date of Patent: *Jun. 25, 2013

(54) PROVIDING COMPONENT CONNECTION INFORMATION

(75) Inventors: Timothy Allen, Santa Cruz, CA (US); Michael Fairman, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/877,843

(22) Filed: Sep. 8, 2010

Related U.S. Application Data

(63) Continuation of application No. 10/956,458, filed on Sep. 30, 2004, now Pat. No. 7,813,914.

(51) Int. Cl.
*G06F 9/455* (2006.01)
*G06F 17/50* (2006.01)

(52) U.S. Cl.
USPC .............................................. 703/25; 716/100

(58) Field of Classification Search
None
See application file for complete search history.

(56) References Cited

U.S. PATENT DOCUMENTS

| | | | |
|---|---|---|---|
| 5,255,203 A | 10/1993 | Agrawal et al. | |
| 5,640,327 A | 6/1997 | Ting | |
| 6,393,506 B1 | 5/2002 | Kenny | |
| 6,519,540 B1 | 2/2003 | Salandro | |
| 6,631,508 B1 | 10/2003 | Williams | |
| 6,721,922 B1 | 4/2004 | Walters et al. | |
| 6,757,882 B2 | 6/2004 | Chen et al. | |
| 6,857,053 B2 | 2/2005 | Bolik et al. | |
| 6,941,538 B2 | 9/2005 | Hwang et al. | |
| 6,983,228 B2 * | 1/2006 | Kodosky et al. | .................. 703/2 |
| 7,177,971 B2 | 2/2007 | Ajanovic et al. | |
| 7,302,667 B1 | 11/2007 | Pritchard | |
| 7,313,761 B1 | 12/2007 | Mcclellan | |
| 7,315,985 B1 | 1/2008 | Gauvin et al. | |
| 7,451,421 B1 | 11/2008 | Bauer et al. | |
| 7,802,221 B1 | 9/2010 | Van Brink et al. | |
| 7,813,914 B1 | 10/2010 | Allen et al. | |
| 2002/0059054 A1 | 5/2002 | Bade et al. | |
| 2003/0009730 A1 | 1/2003 | Chen et al. | |
| 2004/0010652 A1 | 1/2004 | Adams et al. | |
| 2004/0034497 A1 | 2/2004 | Shah et al. | |
| 2004/0064545 A1 | 4/2004 | Miyake | |
| 2005/0091432 A1 | 4/2005 | Adams et al. | |
| 2005/0149551 A1 | 7/2005 | Fong et al. | |
| 2006/0101368 A1 | 5/2006 | Kesarwani et al. | |

OTHER PUBLICATIONS

Altera Corp. "SOPC Bulder User Guide", Jun. 2003, 20 pages.*
Altera Corp. "DSP Builder User Guide", Jul. 2003, 138 pages.*
Altera Corp. "Excalibur, Nios Tutorial", Apr. 2002, 72 pages.*
Timothy Allen, et al., "Providing Component Connection Information," U.S. Appl. No. 60/606,966, filed Sep. 3, 2004.
Timothy Allen, et al. Providing Component Connection Information, U.S. Appl. No. 10/956,458, filed Sep. 30, 2004.

(Continued)

*Primary Examiner* — Suzanne Lo
(74) *Attorney, Agent, or Firm* — Weaver Austin Villeneuve & Sampson LLP

(57) ABSTRACT

Techniques and mechanisms provide design information in a scalable representation. A design includes multiple master components and slave components. The master components and slave components include ports allowing interconnection. Techniques and mechanisms are described for selectively providing a subset of the interconnections between the master components and the slave components.

25 Claims, 10 Drawing Sheets

OTHER PUBLICATIONS

Altera Corporation, 72 page document entitled "Excalibur, Nios Tutorial," Document Version 1.1, Document date Apr. 2002, http://www.altera.com/literature/tt/tt_buis_hw_apex_20k200e.pdf.

Altera Corporation, 14 page document entitled, "Quartus II Handbook, vol. 1, Chapter 2. System Design Using SOPC Builder", Dec. 2004, qii51003-2.1, http://www.altera.com/literature/hb/qts/qts_gii51003.pdf.

Altera Corporation, 14 page document entitled, "Quartus II Handbook, vol. 4, Chapter 2. Tour of the SOPC Builder User Interface," Feb. 2005, QII54002-1.0, http://www.altera.com/literature/hb/qts/qts_qii54002.pdf.

Altera Corporation, 16 page document entitled, "Quartus II Handbook, vol. 4, Chapter 2. Tour of the SOPC Builder User Interface," Mar. 2007, QII54002-1.0, http://www.altera.com/literature/hb/qts/qts_gii54002.pdf.

www.xlinx.com, "Embedded System Tools Reference Manual, Embedded Development Kit, EDK 7,1i," Feb. 15, 2005, Chapters 2-4.

Office Action dated Apr. 2, 2008, from U.S. Appl. No. 11/266,074.
Office Action dated May 21, 2009, from U.S. Appl. No. 11/266,074.
Final Office Action dated Dec. 29, 2009, from U.S. Appl. No. 11/266,074.
Office Action dated Apr. 9, 2007, from U.S. Appl. No. 10/956,458.
Final Office Action dated Oct. 31, 2007, from U.S. Appl. No. 10/956,458.
Office Action dated May 28, 2008, from U.S. Appl. No. 10/956,458.
Final Office Action dated Nov. 28, 2008, from U.S. Appl. No. 10/956,458.
Office Action dated Jun. 10, 2009, from U.S. Appl. No. 10/956,458.
Notice of Allowance dated Feb. 25, 2010, from U.S. Appl. No. 10/956,458.
Notice of Allowance dated May 12, 2010, from U.S. Appl. No. 11/266,074.
Notice of Allowance dated Jun. 14, 2010, from U.S. Appl. No. 10/956,458.
Office Action mailed Feb. 3, 2011 issued in U.S. Appl. No. 12/860,629.
Office Action mailed Jul. 22, 2011 issued in U.S. Appl. No. 12/860,629.
U.S. Appl. No. 12/860,629, "Design tool with graphical interconnect matrix," van Brink et al., filed Aug. 20, 2010.
U.S. Appl. No. 11/266,074, Office Action mailed Dec. 12, 2008.
U.S. Appl. No. 12/860,629, Office Action mailed Nov. 8, 2011.
U.S. Appl. No. 12/860,629, Notice of Allowance mailed Feb. 24, 2012.
U.S. Appl. No. 12/860,629, Allowed Claims, Feb. 24, 2012.

\* cited by examiner

PROVIDING COMPONENT CONNECTION INFORMATION

CROSS-REFERENCE TO RELATED APPLICATIONS

This application claims priority under 35 U.S.C. §120 and is a continuation of co-pending U.S. patent application Ser. No. 10/956,458, filed Sep. 30, 2004, titled "PROVIDING COMPONENT CONNECTION INFORMATION", which is hereby incorporated by reference in its entirety.

U.S. patent application Ser. No. 10/956,458 claims the benefit of U.S. Provisional Application No. 60/606,966, filed Sep. 3, 2004, titled "PROVIDING COMPONENT CONNECTION INFORMATION", which is hereby incorporated by reference in its entirety.

BACKGROUND OF THE INVENTION

1. Field of the Invention

The present invention generally relates to programmable chip systems. More specifically, the invention relates to systems and methods for selectively representing master/slave connections in programmable chip systems.

2. Description of the Prior Art

A digital design for a programmable chip system typically includes a master component coupled to multiple slave components. A master component such as a processor typically sends requests to slave components such as timers and parallel input/output (PIO) interfaces for data. Master components are coupled to slave components through the use of ports. A designer can specify which components are connected. In one example, a timer may only be accessible to one of two processors in a system.

Conventional mechanisms for providing interconnection information are limited. More specifically, when the quantity of data is large and the data is interrelated (e.g., masters, slaves, master-slave connections, etc.), the information displayed can be unwieldy to a user, especially if the user is interested in only a subset of the data. Consequently, it is beneficial to present improved mechanisms for providing interconnection information for programmable chip systems.

SUMMARY OF THE INVENTION

The techniques and mechanisms of the present invention provide programmable chip system design information in flexible and/or scalable representations. A design typically includes multiple master and slave components having ports that allow for interconnection. A representation of multiple master components, slave components, and associated interconnects can be provided such that component relationships are easily identified.

In one example, a flexible and/or scalable patch panel is used to selectively provide or display information about components and component relationships. Information about component parameters can also be provided. The patch panel can represent a connection fabric or a portion of a connection fabric with nodes that allow efficient toggling of connection status.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
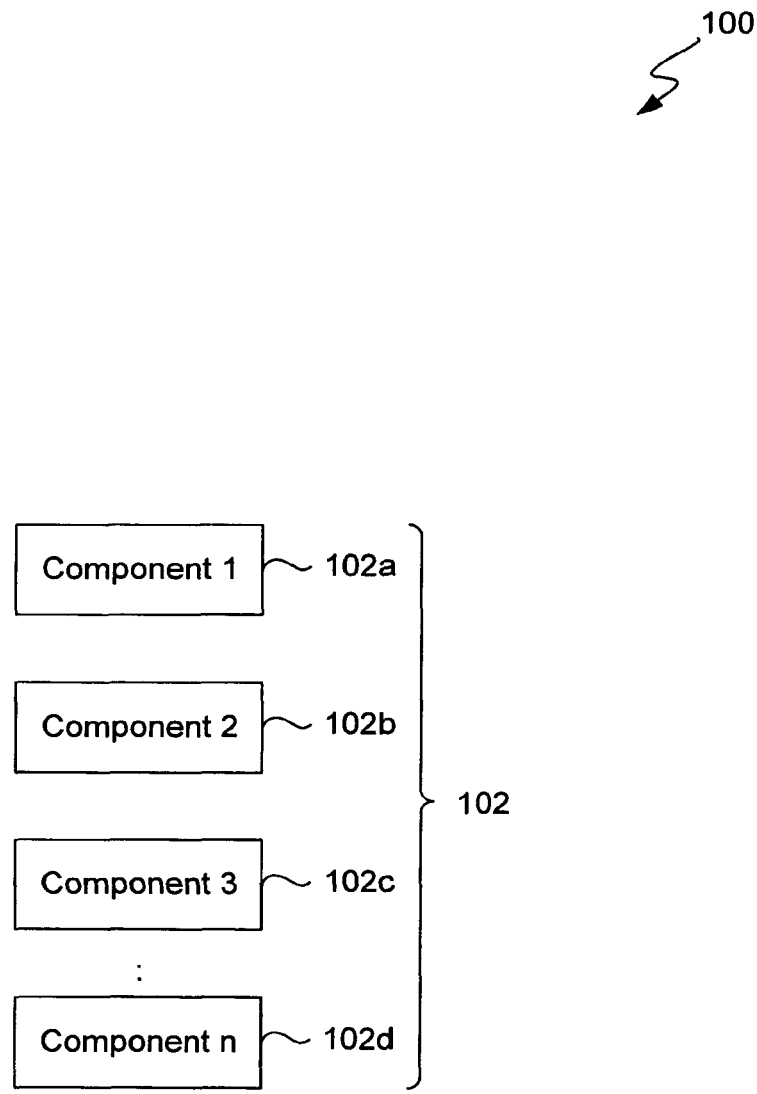
FIG. 1 illustrates one example of a digital design according to various embodiments of the present invention.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For instance, the techniques of the present invention will be described in the context of particular design automation tools. However, it should be noted that the techniques of the present invention can be applied to a variety of tools and associated code provided with the tools. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides techniques for flexibly representing design information. A design includes multiple components that include ports that allow for interconnection.

Programmable chip systems typically include multiple master and slave components. Conventional programmable chip systems include components interconnected using a bus architecture. Using a bus architecture tends to decrease the likelihood that a design includes a large number of master components. However, a simultaneous multiple master interconnection fabric, available from Altera Corporation of San Jose, Calif., enables the efficient use of a larger number of master components.

Consequently, systems including many master components coupled to many slave components become more complex as the interconnection fabric becomes more complex. To facilitate the organization and readability of large amounts of interrelated data, flexible and/or scalable representations are provided in the present invention. For instance, in a multiple master and slave component system, selective and scalable representation can provide an efficient representation of master-slave connections on a master-by-master basis. For instance, a subset of multiple components/ports connected to a particular master may be selectively displayed.

Programmable chip systems present a particularly difficult challenge for visual data representation. Such systems generally include numerous components with multiple master and/or slave connections. In simple systems that include few components and connections, data about a design can be provided in simple tables that can be reviewed in their entirety by a designer without significant loss of efficiency. However, as programmable chip systems become increasingly complex with more components, the presentation of master-slave connections is often complex as well and can fill an entire display screen or more. The volume of data associated with such complex designs can be overwhelming to a user that is manually reviewing the data, especially when the data is presented globally without any selectivity.

According to various embodiments, the present invention allows selective representation of complex interrelated data. Generally, a designer analyzes data from several related components (e.g., slave components having the same master component) simultaneously in order to make informed decisions. For instance, in the case of a multiple master component system in which each master component has numerous connected slave components, it would be useful to display simultaneously all, or a specified subset, of the slave components that connect to a corresponding master component.

Various embodiments of the present invention include scalable representations that allow viewing of subsets of components/ports of interest. Typically, a subset includes information about a component along with its data portions (e.g., ports) and connectivity information. The scalable representations can be displayed in a simple, two-dimensional graphical representation.

The graphical representation of the data can take many forms, depending on the digital design system and/or the preferences of the users, etc. For instance, users often prefer to organize data according to master component connections (e.g., slaves connecting to a particular master), regardless of whether the connections are available as slave component connections (e.g., masters connecting to a particular slave), because these master connections provide clearer organization in a hierarchical or control sense. Therefore, if a user is looking for the number of slave components connected to a particular master component, he can easily scale the representation to fit within a minimum amount of display area. Thus, the invention provides a flexible data organization application that enables the user to find the best mode of representation for a digital design.

FIG. 1 illustrates a digital design 100 according to an exemplary embodiment of the present invention. Digital design 100 generally includes multiple components 102, such as components 1 (i.e., 102a), 2 (i.e., 102b), 3 (i.e., 102c), and so forth to component n (i.e., 102d). Each component is representative of a portion of digital design 100. It should be noted that any number of components may be included in digital design 100. According to a specific embodiment, at least one component is interrelated with another component. For example, one component is a primary component while another component is a corresponding secondary component.

Any component or device that is operable to initiate read and/or write operations by providing control information is referred to herein as a primary component. Primary components are sometimes referred to herein as master components. Control information can include a particular address associated with a secondary component. Any component or device that responds to read or write operations with information sent back to the primary component regarding the read or write operation is referred to herein as a secondary component. Secondary components are sometimes referred to herein as slave components. Some examples of primary components include processors, microcontrollers, and Ethernet devices. Some examples of secondary components include Universal Asynchronous Receiver Transmitters (UARTs), Parallel Input Output (PIO), program memory, and data memory. It should be noted that some components such as an Ethernet component can be both a primary component and a secondary component, because an Ethernet component has the capability of reading and writing to the secondary program memory while also responding to instructions from a primary system CPU.

Figure 2:
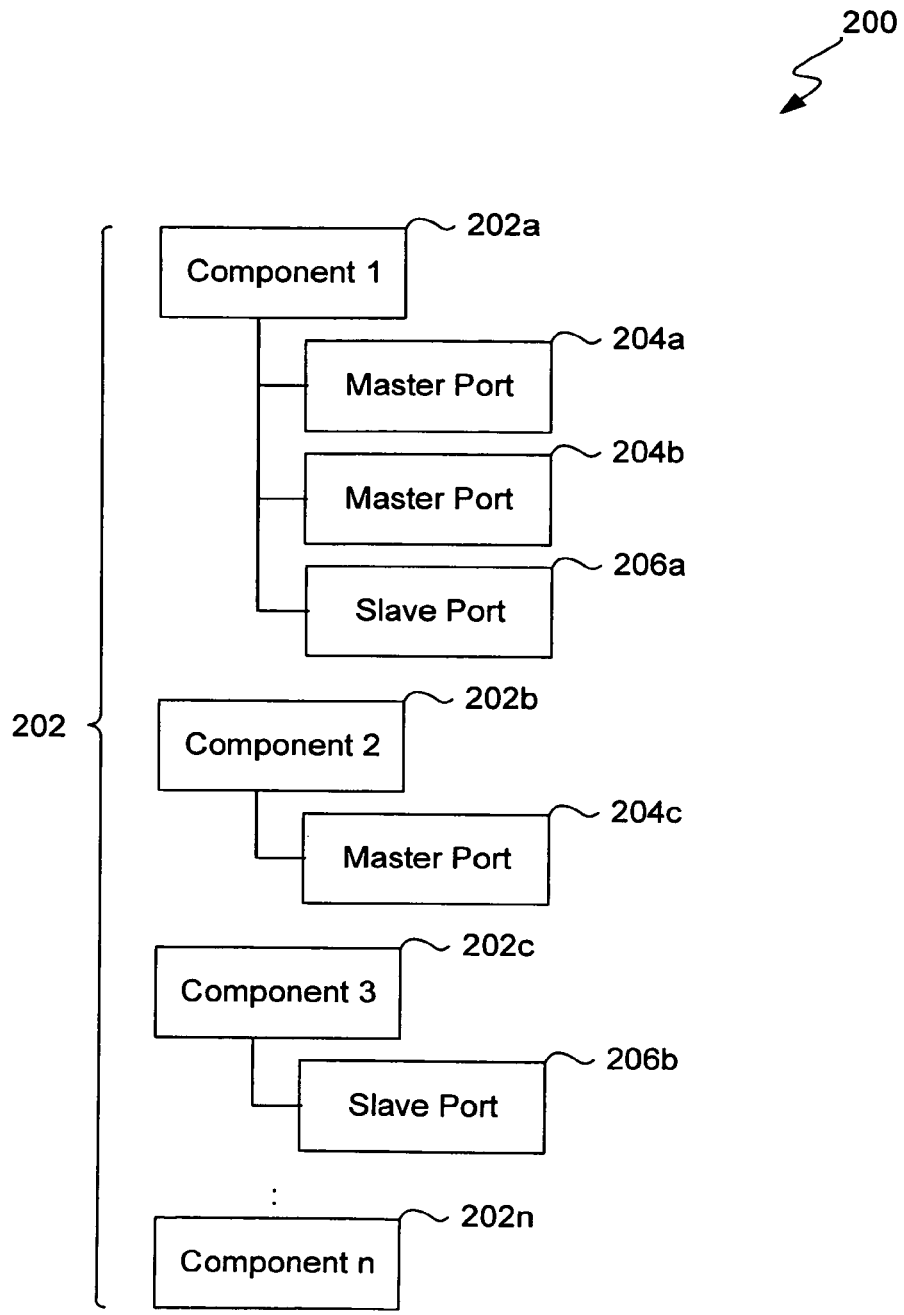
FIG. 2 illustrates another example of a digital design according to various embodiments of the present invention.

FIG. 2 illustrates another digital design 200 according to an exemplary embodiment of the present invention. As shown, digital design 200 includes multiple components 202, such as components 1 (i.e., 202a), 2 (i.e., 202b), 3 (i.e., 202c), and so forth through component n (i.e., 202n). Also shown are multiple ports 204 and 206, which may be used to interconnect the multiple components. For instance, component 1 has two master ports 204a and 204b along with one slave port 206a. Similarly, component 2 has only a master port 204c while component 3 has only a slave port 206b. Each component may have any number of corresponding ports that can be used to provide interconnections between different portions of themselves (e.g., CPU), with other components (e.g., DMA), or both. Typically, the ports are for interconnecting between interrelated components, such as primary and secondary components.

Figure 3:
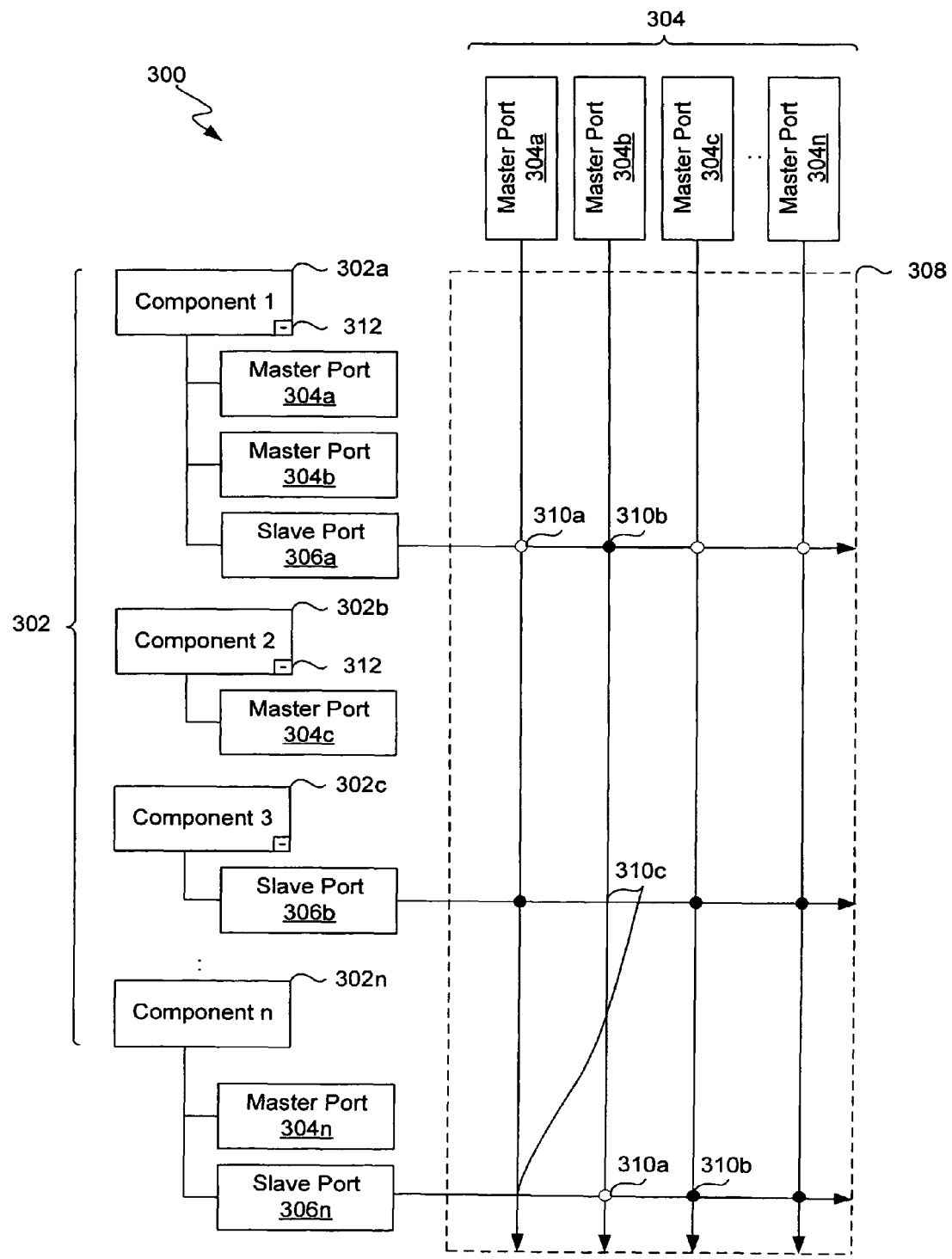
FIG. 3 illustrates a global scalable representation of data relating to interconnections in a digital design according to an exemplary embodiment of the present invention.

In order to effectively provide information about interconnections in a design, simple and practical visual representations are provided according to various embodiments. FIG. 3 illustrates one example of a global scalable representation of a digital design 300 according to various embodiments of the present invention. The global scalable representation provides an expandable as well as a retractable display of connections between multiple components 302 in digital design 300. In this specific embodiment, the multiple components 302 are provided with relationship information (e.g., possible connection, actual connection, no connection) that corresponds to the multiple ports 304/306.

As shown, the multiple components 302, such as components 1 through n, is displayed with corresponding ports. For example, component 1 (i.e., 302a) is shown having master port 304a, master port 304b, and slave port 306a. Component 2 (i.e., 302b) is shown having only master port 304c. Component 3 (i.e., 302c) is shown having only slave port 306b. The remaining components (though component n) are similarly shown with their corresponding ports.

A patch panel 308 is also shown. The patch panel provides information about the relationships between the multiple components 302 via respective master ports 304 (e.g., 304a, 304b, 304c) and/or slave ports 306 (e.g., 306a, 306b, 306n). Connectable nodes 310a/310b and non-connectable nodes 310c are used to represent relationship information (e.g., whether a master-slave connection is available; how many connections correspond to a particular component; the complexity of the digital design; etc.). An open connectable node 310a denotes a possible connection (e.g., electrical connection) between a pair of components/ports, whereas a closed connectable node 310b denotes a made connection (e.g. electrical connection) between a pair of components/ports. Open connectable node 310a may be toggled to closed connectable node 310b and vice versa through a toggling feature. According to one embodiment, the toggling feature includes a user input device such as a mouse, keyboard, or the like, that can be used to change the status of a node. Non-connectable nodes 310c denote that no connections are available between the pair of components/ports indicated.

To further elaborate, patch panel 308 provides information about interconnectivity between the multiple components 302. The connectivity information may be organized based on the type of connections that are to be displayed. For example, the connectivity information may be organized such that master connections, slave connections, or both, are displayed. As shown in FIG. 3, patch panel 308 provides connectivity information based on master connections. That is, patch panel 308 is configured to organize the connectivity of each component based on any connections to a master component via corresponding slave ports. According to one embodiment, slave ports (e.g., 306a, 306b, 306n) are shown as rows and the connected master ports (e.g., 304a, 304b, 304c, 304n) are shown as columns. For instance, patch panel 308 illustrates a made connection between slave port 306a of component 1 (i.e., 302a) and master port 304b of component 1 (i.e., 302a). On the other hand, patch panel 308 illustrates no available connection between slave port 306b of component 3 (i.e., 302c) and master port 304b of component 1 (i.e., 302a). Yet, patch panel 308 illustrates a made connection between slave port 306b of component 3 (i.e., 302c) and master port 304c of component 2 (i.e., 302b). Patch panel 308 may be provided in any number of different arrangements. For example, the two-dimensional patch panel can be replaced with a three-dimensional patch panel or any other multi-dimensional patch panel. Typically, patch panel 308 can represent a connection fabric between the multiple components/ports in digital design 300. Although each node generally denotes the relationship between a pair of components/ports, each node may be provided to denote the relationship between multitudes of components/ports. Therefore, patch panel 308 can be configured to convey the relationship information as necessary according to a specific application.

As mentioned earlier, a global scalable representation provides an expandable as well as a retractable display of all of the multiple components 302 in digital design 300. That is, the multiple components 302 are shown expanded with corresponding ports and connections in an initial display. In cases where digital design 300 includes a large number of components 302 and relatively complex interrelated data (e.g., master-slave connections), the global scalable representation provides the possibility of adjusting the amount of digital design data provided in a display. Typically, a scalable indicator 312 (e.g., "+" or "−" indicator) may be used to signal the exposing/hiding of various data portions (e.g., ports 304/306) of a component. As such, information relating to portions of digital design 300 can be provided in amounts that can be reasonably and efficiently viewed and interpreted.

Figure 4A:
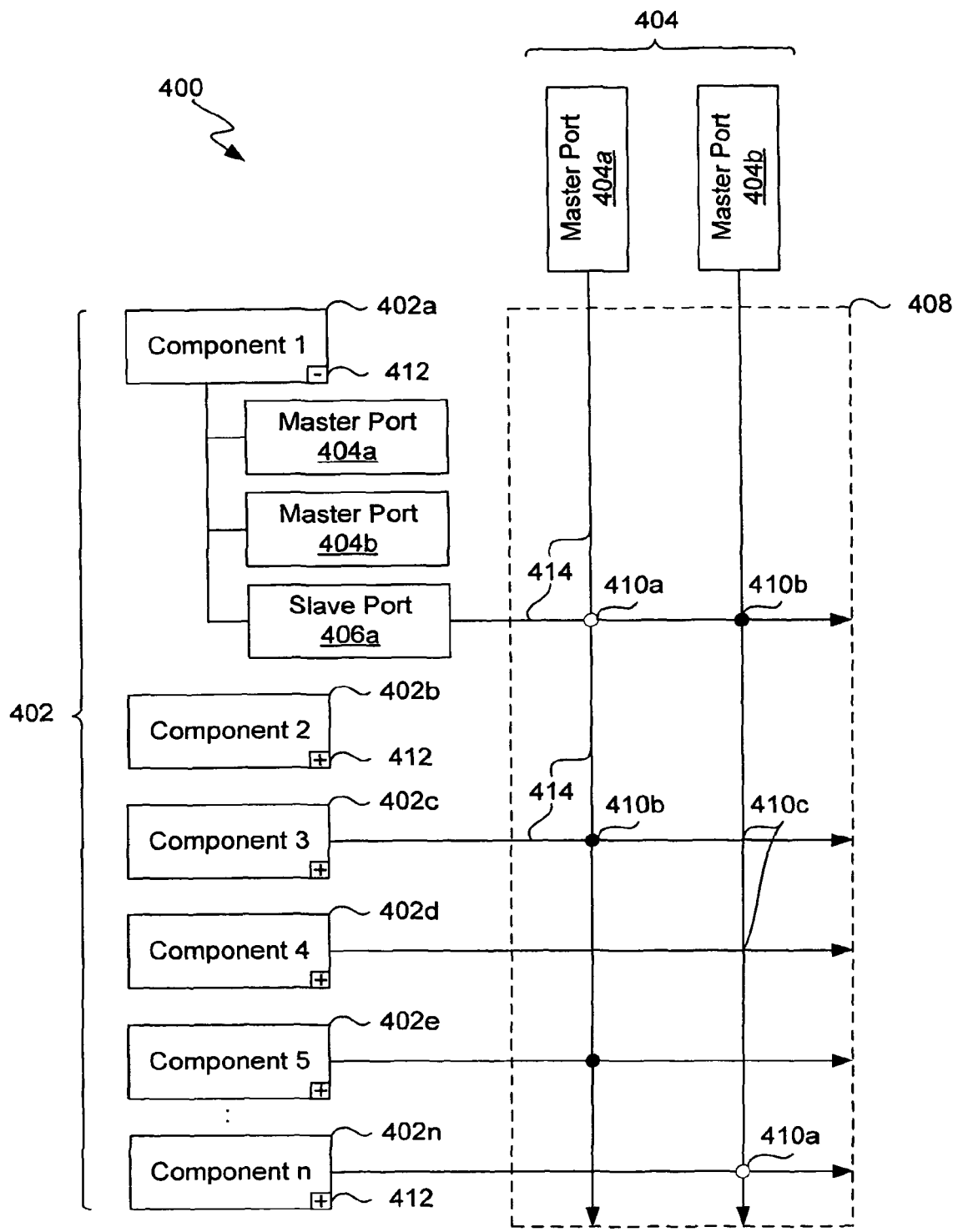
FIG. 4A illustrates a selective scalable representation of data relating to interconnections in a digital design according to an exemplary embodiment of the present invention.

FIG. 4A illustrates a selective scalable representation of data relating to interconnections in a digital design according to an exemplary embodiment of the present invention. In the selective scalable representation shown, only a subset of multiple components 402 in digital design 400 is displayed along with corresponding ports and connections. For example, only component 1 (i.e., 402a) has its respective ports (i.e., master ports 404a/b and slave port 406a) displayed together with any respective connections to another component/port via a patch panel 408.

A selective scalable representation may be configured to display any subset of the multiple components/ports featured in a digital design 400. In one embodiment, the subset allows viewing on a master-by-master basis. For example, information about master component 1 (i.e., 402a) along with its various data portions can be selectively represented by having component 1 scaled up (e.g., exposed) while other components are scaled down (e.g., hidden). As shown, master ports corresponding to only component 1 are displayed as columns and any connected slave component (e.g., 402c) or combination of master and slave component (e.g., 402a) is displayed along the rows. Likewise, information about master component 2 (i.e., 402b) along with its various data portions can be selectively displayed by having component 2 scaled up (e.g. exposed) while other components are scaled down (e.g., hidden). In another embodiment, the subset allows viewing on a slave-by-slave basis, which is similar to a master-by master basis but focuses on displaying information about slaves. In general, the subset may be displayed initially or reduced from a global scalable representation, as shown in FIG. 3. Furthermore, the subset may even be predetermined in some embodiments.

In the present embodiment, patch panel 408 and patch panel 308 can share many of the same features. For instance, patch panel 408 provides information about relationships between the multiple components 402 via respective master ports 404 (e.g., 404a, 404b, through 404n (not shown)) and/or slave port 406 (e.g., 406a through 406n (not shown)). Connectable nodes 410a/410b and non-connectable nodes 410c are used to represent any relationship information (e.g., whether a master-slave connection is available; how many connections correspond to a particular component; how complex is the digital design; etc.) between components/ports. An open connectable node 410a denotes a possible connection between a pair of components/ports, whereas a closed connectable node 410b denotes a made connection between a pair of components/ports. Open connectable node 410a may be toggled to closed connectable node 410b and vice versa through a toggling feature. According to one embodiment, the toggling feature includes a user input device such as a mouse, keyboard, or the like, that can be used to change the status of a node. Non-connectable nodes 410c denote that no connections are available between the pair of components/ports.

As mentioned earlier, patch panel may be provided in any number of different arrangements. However, in this embodiment, patch panel 408 includes a rectangular arrangement of elements in rows and columns. For example, patch panel 408 includes a matrix of interconnects 414. In other words, interconnects 414 are shown extending vertically and horizontally across patch panel 408 in defining the relationships between the components. Specifically, master ports 404 are shown connected to vertical interconnects 414 in columns whereas slave ports 406 are shown connected to horizontal interconnects 414 in rows. As such, patch panel 408 facilitates an efficient digital design presentation that can easily be viewed and interpreted.

In one embodiment, the scalability of the representation is dependent upon and/or proportionate to the scaled component. That is, whenever a component is scaled to expose or hide various data portions (e.g., ports 404/406) of the component, patch panel 408 and/or the overall representation will be correspondingly modified to reflect the scaling. For example, if component 2 (i.e., 302b) of FIG. 3 is scaled by selecting the "−" indicator 312, master port 304c (shown horizontally in a row and vertically in a column) along with portions of its connectivity to other components/ports (e.g., slaves) would be selectively removed from viewing in patch panel 308 and/or the overall representation. As such, a condensed and simplified representation such as in FIG. 4A can result. Alternatively, exposing various data portions of a component can be used to scale patch panel 408 to include more information. Therefore, digital design data of interest can be selectively provided to the user. Accordingly, the digital design data can be presented in a more convenient manner for viewing and interpreting by the user.

Connectivity information may still be provided regardless of whether the representation has been scaled down (e.g., hiding data portions of components). For instance, components 3 (i.e., 402c), 4 (i.e., 402d), 5 (i.e., 402e), and n (i.e., 402n) are shown with connectivity information via patch panel 408 despite being scaled down (e.g., hidden, but available with "+" indicator 412). This allows a designer to easily identify whether a component has any connectivity information associated with it. As mentioned earlier, the connectivity information may be organized based on the type of connections to be displayed. Therefore, if master connections are used to organize the connectivity information as in FIG. 4A, component 2 (i.e., 402b) can be interpreted to have only master ports associated with it since no connectivity information is shown in patch panel 408. As such, component 2 is a master component. Other similar interpretations can be made based on the available connectivity information. Typically, the connectivity information is predetermined based on the various components 402 of digital design 400. However, the connectivity information can be changed by the designer (e.g., via connectable nodes 410a and 410b).

Figure 4B:
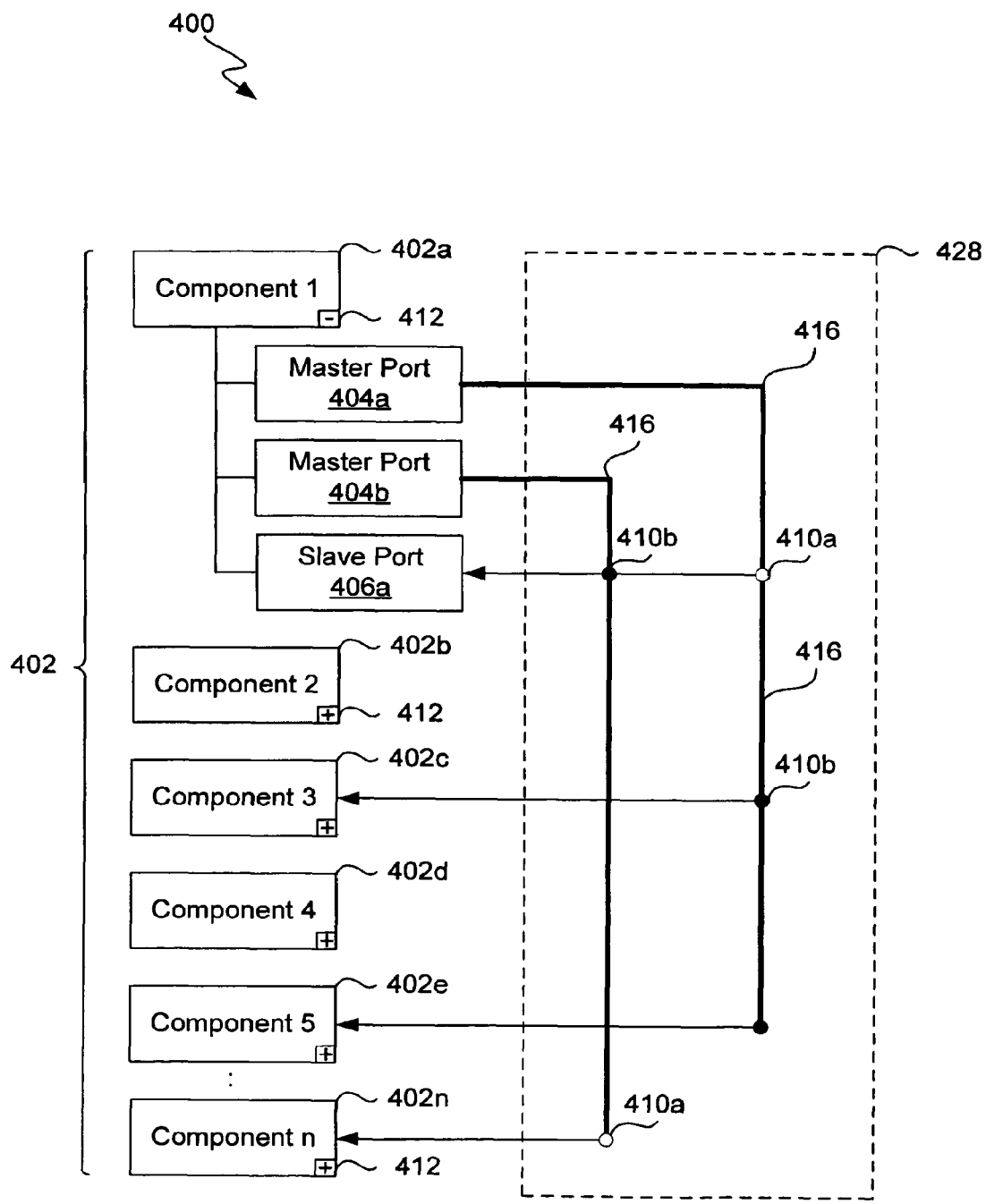
FIG. 4B illustrates a selective scalable representation of data relating to interconnections in a digital design according to another exemplary embodiment of the present invention.

FIG. 4B illustrates a selective scalable representation of data relating to interconnections in a digital design according to another exemplary embodiment of the present invention. In the selective scalable representation shown, a subset of multiple components 402 in digital design 400 is again illustrated as shown in FIG. 4A. However, patch panel 428 is provided in a different arrangement. In this embodiment, patch panel 428 includes a plurality of looped interconnects 416.

Looped interconnect 416 may either be a single-looped interconnect or a multi-looped interconnect. A single-looped interconnect typically connects (e.g., via a connectable node 410a/b) a pair of elements together such as a master port/component to a slave port/component. On the other hand, a multi-looped interconnect is typically a cascade of single-looped interconnects. In one embodiment, the multi-looped interconnect includes multiple single-looped interconnects connected to a common master port. For example, as shown in FIG. 4B, master port 404a is connected with a multi-looped interconnect to slave port 406a, slave component 402c, and slave component 402e. In addition, master port 404b is connected with a multi-looped interconnect to slave port 406a and slave component 402n.

Figure 4C:
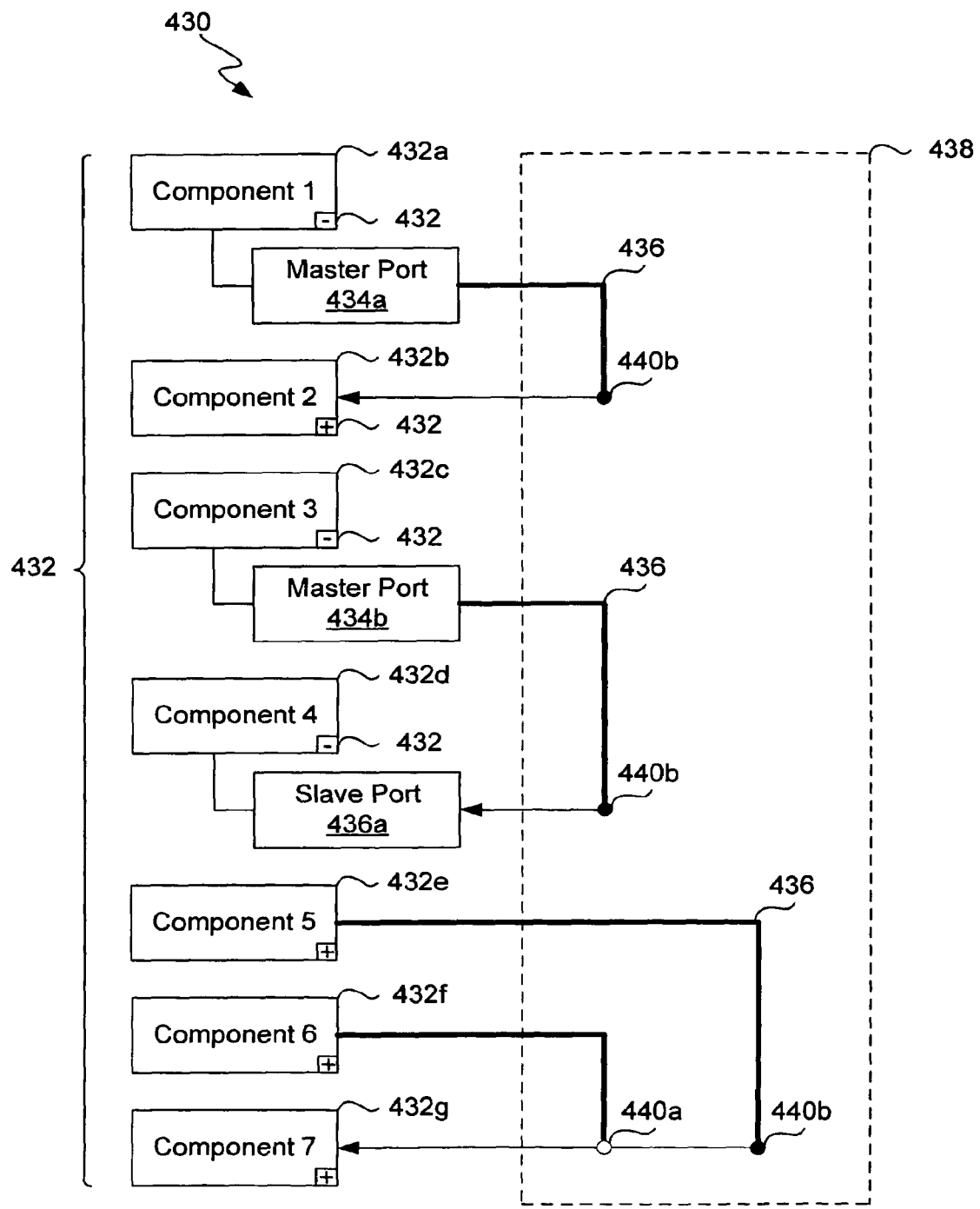
FIG. 4C illustrates a selective scalable representation of data relating to interconnections in a digital design according to yet another exemplary embodiment of the present invention.

FIG. 4C illustrates a selective scalable representation of data relating to interconnections in a digital design according to yet another exemplary embodiment of the present invention. In this embodiment, patch panel 438 and patch panel 428 can share many of the same features. For instance, patch panel 438 provides information about relationships between the multiple components 432 via respective master ports 434 (e.g., 434a, 434b) and/or slave port 436 (e.g., 436a). Connectable nodes 440a/440b are used to represent any relationship information (e.g., whether a master-slave connection is available; how many connections correspond to a particular component; etc.) between components/ports. An open connectable node 440a denotes a possible connection between a pair of components/ports, whereas a closed connectable node 440b denotes a closed connection between a pair of components/ports. In addition, scalable indicators 432 can be implemented with this specific embodiment.

Patch panel 438 is also represented in a looped interconnect arrangement. As shown, patch panel 438 includes a plurality of looped interconnects 436, such as the single-looped interconnect connecting master port 434a to slave component 432b and the single-looped interconnect connecting master port 434b to slave port 436a. On the other hand, a multi-looped interconnect is also shown as a cascade of single-looped interconnects. In one embodiment, the multi-looped interconnect includes multiple single-looped interconnects connected to a common slave port. For example, as shown in FIG. 4C, master component 432e and master component 432f are connected with a multi-looped interconnect to slave component 432g. Loop interconnects 436 may assume any appearance to facilitate easy identification of the components' relationships. For example, again as shown in FIG. 4C, the thicknesses or colors of the loops may vary to identify connections.

In general, a single-looped interconnect resembles an open loop, such as a "U" shaped loop, with ends connected to different components/ports. On the other hand, a multi-looped interconnect generally resembles a cascade of open loops either chain-linked together (See FIG. 4B) or overlapping/superimposing each other (See FIG. 4C). The advantages of having looped interconnects include maximizing the area available for displaying the digital design. For example, connected master ports 404a and 404b shown on the columns in FIG. 4A may be removed since they can be easily represented on the rows as shown in FIG. 4B. In addition, looped interconnects may provide a cleaner and less cluttered representation. For example, many portions of the matrix of interconnects shown in FIG. 4A occupy area space that can be made available with the simpler representation of looped interconnects as shown in FIG. 4B. As such, looped interconnects can further facilitate an efficient representation of a digital design.

To further elaborate, as compared to conventional methods, looped interconnects enhance the possibilities of representing more of a digital design in a given area with more clarity and efficiency. In one embodiment, the selective presentation of FIG. 4C allows the segregation of the digital design representation into logical groups. In one example, as shown in FIG. 4C, single-looped interconnects are provided together as a group whereas multi-looped interconnects are provided together as another group. The ordering of the groups may further maximize the area available. For instance, single-looped interconnects may be provided before (e.g., above portion of the display) the multi-looped interconnects to allow more available area. In general, groups may be formed based on a common characteristic, such as a bus type. This is advantageous when heterogeneous bus types (e.g., Avalon, Avalon-Tristate, Atlantic—all available from Altera Corporation of San Jose, Calif.) are present in the digital design since they may be more easily identified and controlled (e.g., minimizing illegal connections between components on different buses) with the groupings.

Looped interconnects also allow horizontal compaction of the selective representation. For instance, as shown in FIG. 4C, the single-loop interconnect connecting components 1 and 2 can be shown with its vertical section aligned in the same column as the vertical section for the single-loop interconnect connecting components 3 and 4. That is, since it is not necessary to represent master port/component connections in individual columns as shown in FIG. 4A, loop interconnects can be compacted horizontally to maximize available area. The arrangement (e.g., ordering of the components) of the digital design in the selective representation can be generated to consume the least amount of area (e.g., columns). According to various embodiments, the lower bound on the number of columns needed in the horizontal compaction is no fewer than the number of master components/ports that share the most shared slave component/port. For example, if a slave component is shared by two master components, 2 columns are used as shown in FIG. 4C.

In digital designs that include sparsely connected multi-master systems or many master-slave component pairs, either as individual pairs (e.g., (Master, Slave)) or chained pairs (e.g., (Slave, Master) to (Slave, Master) to (Slave, Master) . . . ), horizontal compaction of the selective representation with looped interconnects can free up more space than a matrix of interconnects, maximizing the amount of information that can be displayed in a given area. The matrix of interconnects increases in display columns exponentially with each master component/port displayed. On the other hand, looped interconnects will increase in display columns at a slower rate, especially if horizontal compaction is implemented according to the present invention. Moreover, horizontal compaction can further minimize illegal connections between components.

Figure 5:
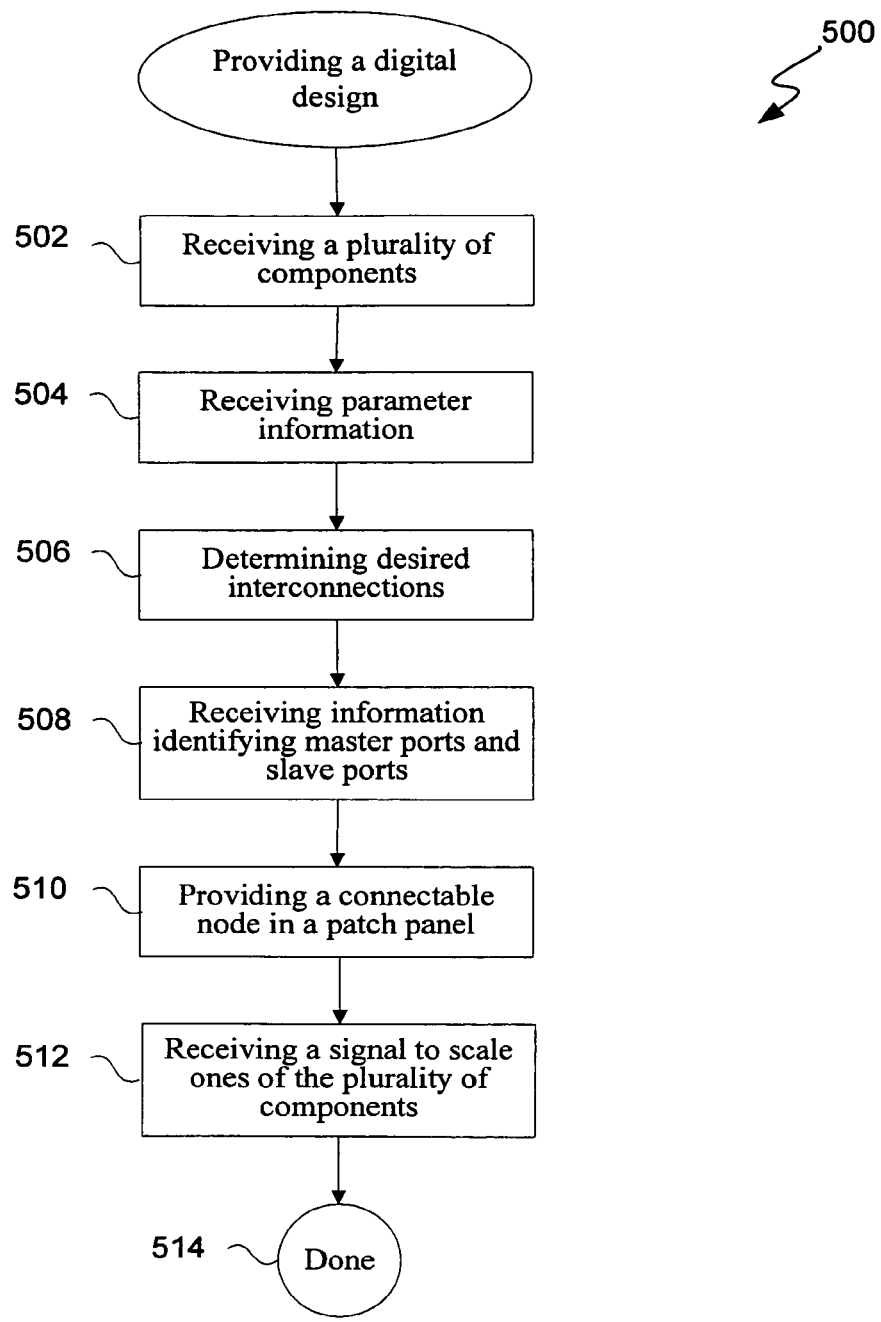
FIG. 5 is a flowchart illustrating a typical process flow of providing a digital design according to various embodiments of the present invention.

FIG. 5 is a flowchart illustrating a typical process flow 500 for providing a digital design according to various embodiments of the present invention. Process flow 500 typically starts with an operation of receiving multiple components for implementing the digital design. Multiple ports are associated with the multiple components. The multiple ports allow selective communication between the multiple components. Typically, this operation includes receiving the multiple components from a library as in operation 502 and/or receiving parameter information associated with the multiple components as in operation 504.

Ports associated with the multiple components may include master ports and slave ports. In one embodiment, master ports associated with the multiple components are coupled to slave ports associated with the multiple components. In another embodiment, the connection fabric is a simultaneous multiple primary component fabric.

Next, the operation of connecting the multiple components using the multiple ports to form a connection fabric may be performed. This may include determining desired interconnections between master ports and slave ports as in operation 506. Determination may be based on a variety of factors, such as the system architecture or relationship between the components. The desired interconnection may further be predetermined or user configurable. This operation may also include receiving information (e.g., component interface, component parameterization, etc.), identifying master ports and slave ports as in operation 508, and/or providing a connectable node in a patch panel as in operation 510. The connectable node in the patch panel may be toggled to form a connection.

In one embodiment, the patch panel shows connectable nodes and connected nodes associated with a simultaneous multiple primary component fabric. Generally, the simultaneous multiple primary component fabric allows multiple master components/ports to communicate with multiple slave components/ports simultaneously. For example, a simultaneous multiple primary component fabric integrated system is described in U.S. patent application Ser. No. 10/227,504, filed Aug. 23, 2002, issued as U.S. Pat. No. 6,857,035 on Jan. 26, 2005, the contents of which is hereby incorporated by reference.

Next, the operation of selectively displaying a subset of the multiple components along with a portion of the connection fabric may be performed. This may include receiving a signal to scale (e.g., hide or expose) any of the multiple components as in operation 512. Finally, process flow 500 ends at operation 514. It will be obvious to those skilled in the art that any portion of process flow 500 may be omitted, modified, or repeated to provide design data in accordance to the present invention. For example, by repeating operation 512, the present invention allows efficient viewing of master-slave connections on a master-by-master basis.

Figure 6:
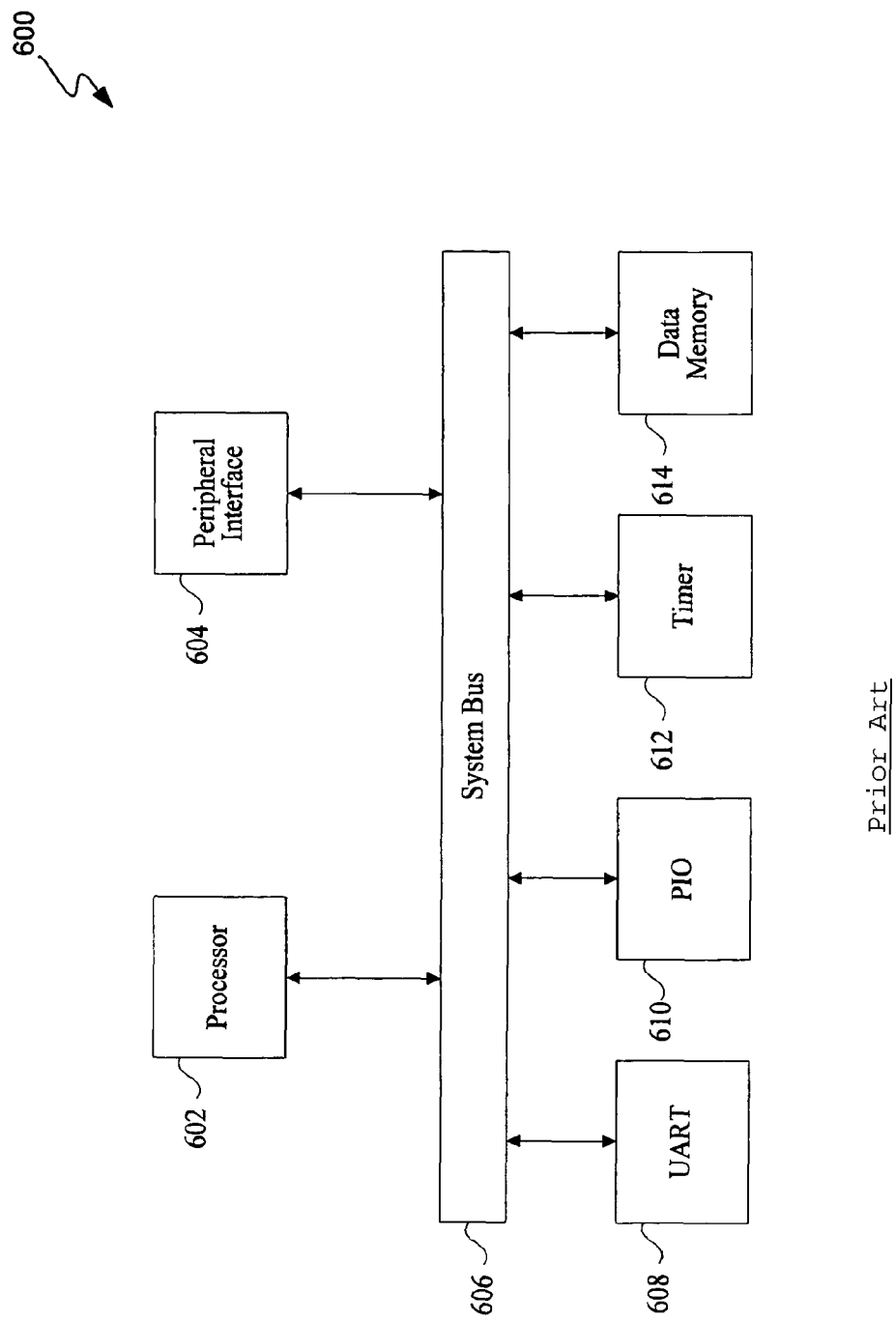
FIG. 6 is a diagrammatic representation showing a digital system on a programmable chip.

FIG. 6 is a diagrammatic representation showing a digital system 600 on a programmable chip having a processor core, peripheral devices, and peripheral interfaces. Peripheral devices and peripheral interfaces are herein referred to as components. The system on a programmable chip includes processor core 602 and a peripheral interface 604 as well as peripheral components UART 608, PIO 610, timer 612, and data memory 614. In some examples, the peripheral interface 604 is a memory controller with an associated bus bridge. It should be noted that the system can include both on-chip and off-chip memory.

System bus 606 provides interconnectivity amongst the components in digital system 600. In one embodiment, system bus 606 includes a conventional bus architecture. In another embodiment, system bus 606 includes a simultaneous multiple primary component fabric, such as the Avalon™ Switch Fabric available from Altera Corporation, San Jose, Calif.

The programmable chip uses different types of resources that can be interchangeably used in different allocations to implement the system on a programmable chip. In one example, the programmable chip uses logic elements for implementing each of the various components on the programmable chip.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and fast cascade chain, register and preset/reset logic for the register.

Figure 7:
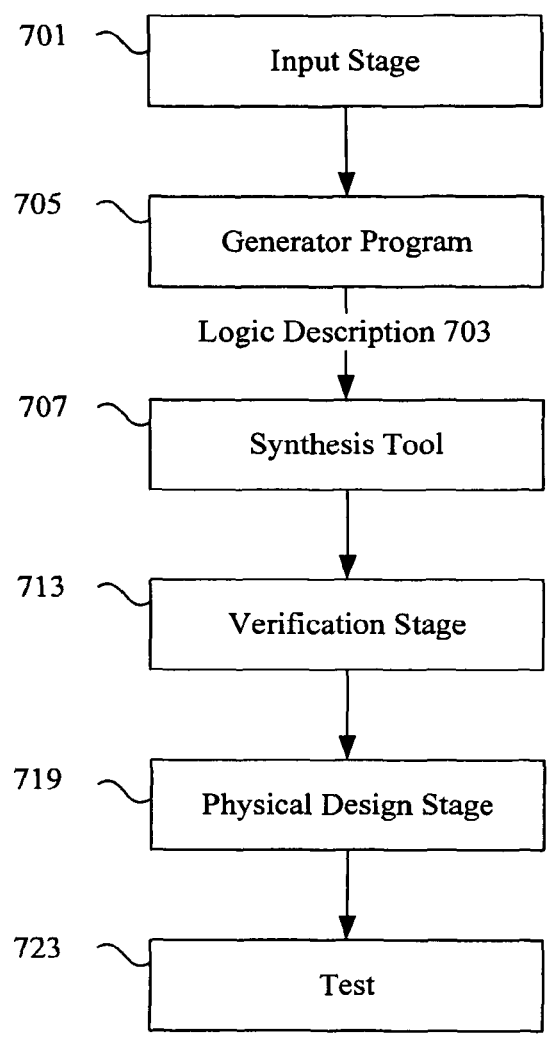
FIG. 7 is a diagrammatic representation showing implementation of a programmable chip.

FIG. 7 is a diagrammatic representation showing implementation of an electronic device (e.g., programmable chip) using a programmable chip tool. An input stage 701 receives selection information typically from a user for logic such as a processor core as well as other components such as a streaming output device to be implemented on an electronic device. A generator program 705 creates a logic description and provides the logic description along with other customized logic to any of a variety of synthesis tools, place and route programs, and logic configuration tools to allow a logic description to be implemented on an electronic device.

In one example, an input stage 701 often allows selection and parameterization of components to be used on an electronic device. In some examples, components provided to an input stage include intellectual property functions, megafunctions, and intellectual property cores. The components may be stored and retrieved from a library or database. The input stage 701 may be a graphical user interface using wizards for allowing efficient or convenient entry of information. The input stage may also be a text interface or a program reading a data file such as a spreadsheet, database table, or schematic to acquire selection information. The input stage 701 produces an output containing information about the various components selected.

In typical implementations, the generator program 705 can identify the selections and generate a logic description with information for implementing the various components. The generator program 705 can be a Perl script creating HDL files such as Verilog, Abel, VHDL, and AHDL files from the module information entered by a user. According to various embodiments, the generator program 705 also provides information to a synthesis tool 707 to allow HDL files to be automatically synthesized. In some examples, a logic description is provided directly by a designer. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 701, generator program 705, and synthesis tool 707 can be separate programs. The interface between the separate programs can be a database file, a log, or simply messages transmitted between the programs. For example, instead of writing a file to storage, the input stage 701 can send messages directly to the generator program 705 to allow the generator program to create a logic description. Similarly, the generator program can provide information directly to the synthesis tool instead of writing HDL files. Similarly, input stage 701, generator program 705, and synthesis tool 707 can be integrated into a single program.

For example, SOPC Builder tool available from Altera Corporation, San Jose, Calif. integrates different stages of the electronic device implementation into a single program while implementing various techniques and mechanisms of the present invention. In particular, SOPC Builder tool provides system-level design flows for SOPC architectures. SOPC Builder tool may automatically generate interconnect logic (e.g., Avalon™ switch fabric) connecting components used in SOPC applications. The components include embedded processors that may either be internal or external to the FPGA and peripherals.

A user may select various components and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 707.

A synthesis tool 707 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 713 typically follows the synthesis stage 707. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 713, the synthesized netlist file can be provided to physical design tools 719 including place and route and configuration tools. A place and route tool typically locates logic cells on specific logic elements of a target hardware device and connects wires between the inputs and outputs of the various logic elements in accordance with logic required to implement an electronic design. The device can also be physically tested at 723.

For programmable logic devices, a programmable logic configuration stage can take the output of the place and route tool to program the logic device with the user selected and parameterized components. According to various embodiments, the place and route tool and the logic configuration stage are provided in the Quartus Development Tool, available from Altera Corporation of San Jose, Calif.

As noted above, different stages and programs can be integrated in a variety of manners. According to one embodiment, the input stage 701, the generator program 705, the synthesis tool 707, the verification tools 713, and physical design tools 719 are integrated into a single program. The various stages are automatically run and transparent to a user. The program can receive the user-selected components, generate a logic description depicting logic for implementing the various selected components, and implement the electronic device. As will be appreciated by one of skill in the art, HDL files and EDF files are mere examples of a logic description. Other file formats as well as internal program representations are other examples of a logic description.

Figure 8:
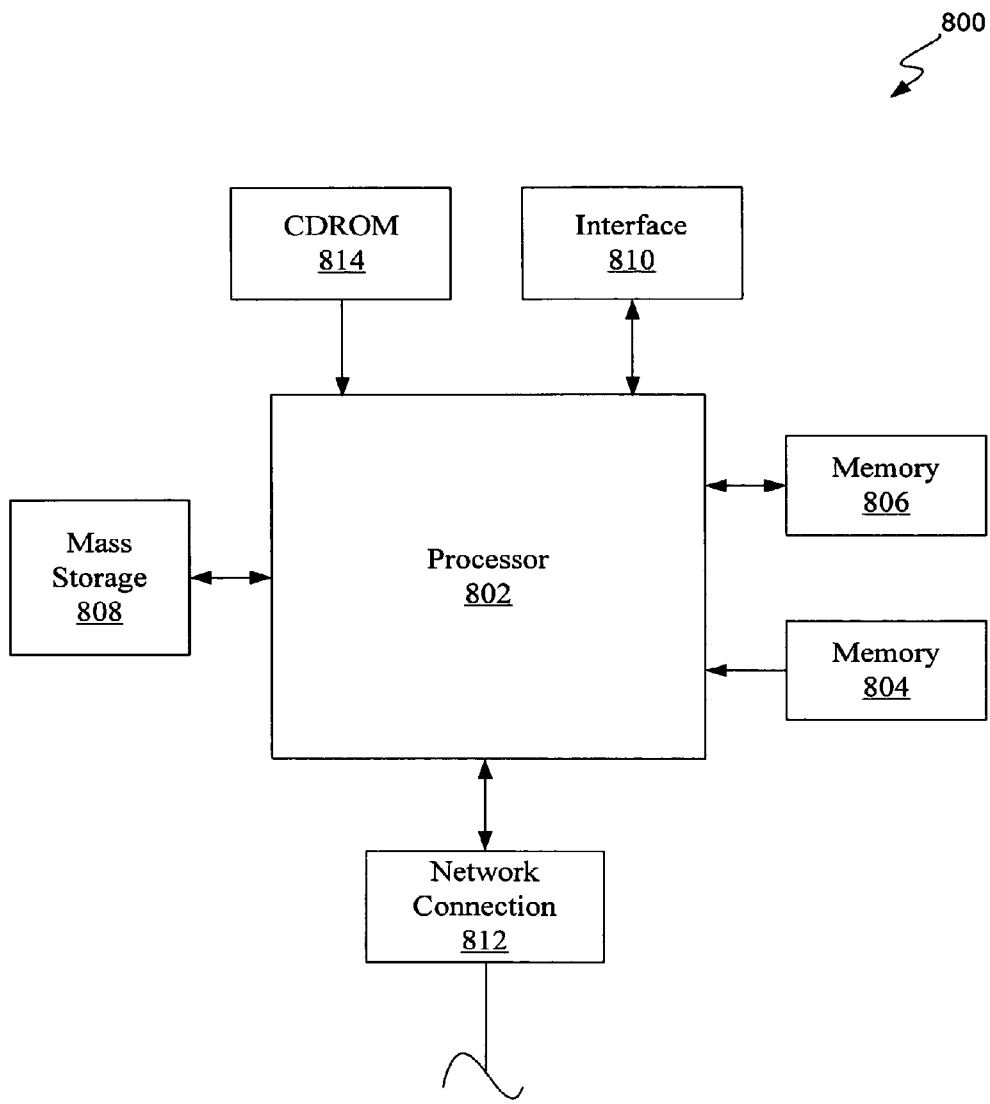
FIG. 8 illustrates a computer system suitable for implementing various embodiments of the present invention.

FIG. 8 illustrates a computer system suitable for implementing various embodiments of the present invention. The computer system 800 includes any number of processors 802 (also referred to as central processing units, or CPUs) that are coupled to devices including memory 806 (typically a random access memory, or "RAM"), memory 804 (typically a read only memory, or "ROM"). The processors 802 can be configured to provide a graphics user interface with effective visual representations according to various embodiments of the present invention. Some representations may be specifically designed to display selective interrelated data, such as the master and/or slave connections of components, from programmable chip systems implementing any of a variety of different system architectures. In one example, programmable chip systems having multiple master and slave components are interconnected with conventional bus architectures. As is well known in the art, memory 804 acts to transfer data and instructions uni-directionally to the CPU and memory 806 is used typically to transfer data and instructions in a bi-directional manner.

Both of these memory devices may include any suitable type of the computer-readable media described above. A mass storage device 808 is also coupled bi-directionally to CPU 802 and provides additional data storage capacity and may include any of the computer-readable media described above. The mass storage device 808 may be used to store programs, data and the like and is typically a secondary storage medium such as a hard disk that is slower than memory. The mass storage device 808 can be used to hold a library or database of prepackaged logic or intellectual property functions, as well as information on generating particular configurations. It will be appreciated that the information retained within the mass storage device 808, may, in appropriate cases, be incorporated in standard fashion as part of memory 806 as virtual memory. A specific mass storage device such as a CD-ROM 814 may also pass data uni-directionally to the CPU.

CPU 802 is also coupled to an interface 810 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Video monitors can be used to display wizards and subwizards to a user. Finally, CPU 802 optionally may be coupled to a computer or telecommunications network using a network connection as shown generally at 812. With such a network connection, it is contemplated that the CPU might receive information from the network, or might output information to the network in the course of performing the above-described method steps. It should be noted that the system 800 may also be associated with devices for transferring completed designs onto a programmable chip. The above-described devices and materials will be familiar to those of skill in the computer hardware and software arts.

The hardware elements described above may be configured to act as multiple software modules for performing the operations of this invention. For example, instructions for running a tool, generator program, input stage (e.g., a wizard), and/or compiler may be stored on mass storage device 808 or 814 and executed on CPU 802 in conjunction with primary memory 806.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, although the present invention has been discussed primarily in the context of visually representing connections between masters and slaves in a multi-master system, the present invention is suitable for other data applications and may be tailored correspondingly. That is, the present invention may be adapted for analysis of other design data, such as the connections between different modules, and the like. Therefore, the scope of the invention should be determined with reference to the appended claims.

What is claimed is:

1. A method for providing a digital design, said method comprising:
   receiving, at an interface, a plurality of components for implementing the digital design on a programmable chip, wherein the plurality of components include a master component and a slave component, wherein the slave component responds to the master component, wherein the plurality of components includes a plurality of ports including a master port and a slave port, wherein the master port is connected to the slave port;
   forming a patch panel by using a processor, wherein said forming the patch panel comprises:
      forming the patch panel by connecting at least two components of the plurality of components with an interconnect, wherein the at least two components of the plurality of components include the master component and the slave component, wherein all ends of the interconnect are only on one side of the patch panel; and
      forming a node of the patch panel, wherein the node is represented as a closed connection between the plurality of ports or a possible connection between the plurality of ports;
   displaying, via a display device, the patch panel; and
   displaying, via the display device, the master component and the slave component only on one side of the patch panel, wherein the display device is connected to the processor.

2. A method in accordance with claim 1, further comprising displaying, via the display device, the plurality of ports only on one side of the patch panel.

3. A method in accordance with claim 1, wherein said displaying the master component and the slave component only on one side comprises displaying the master component and the slave component along a plurality of rows.

4. A method in accordance with claim 1, wherein said displaying the master component and the slave component only on one side comprises displaying the master component and the slave component as vertically aligned along a plurality of rows.

5. A method in accordance with claim 1, further comprising connecting the master port with the slave port via a single-looped interconnect of the patch panel, wherein the single-looped interconnect includes the node.

6. A method in accordance with claim 1, further comprising connecting the master port to a plurality of slave ports via a multi-looped interconnect, wherein the multi-looped interconnect includes the node.

7. A method in accordance with claim 1, further comprising:
   connecting the master port with the slave port via a first single-looped interconnect of the patch panel, wherein the first single-looped interconnect includes the node;
   connecting the master port to a plurality of slave ports via a first multi-looped interconnect, wherein the first multi-looped interconnect includes the node; and
   displaying the first single-looped interconnect and a second single-looped interconnect above the first multi-looped interconnect and a second multi-looped interconnect.

8. A method in accordance with claim 1, further comprising:
   connecting the master port with the slave port via a single-looped interconnect of the patch panel, wherein the first single-looped interconnect includes the node; and aligning a vertical section of the single-looped interconnect with a vertical section of another single-looped interconnect.

9. A method in accordance with claim 1, wherein the node is represented as the possible connection in a first state and as the closed connection in a second state.

10. A non-transitory computer-readable medium encoded with computer-readable program code that is executed by a processor to perform a method comprising:
receiving, at an interface, a plurality of components for implementing a digital design on a programmable chip, wherein the plurality of components include a master component and a slave component, wherein the slave component responds to the master component, wherein the plurality of components includes a plurality of ports including a master port and a slave port, wherein the master port is connected to the slave port;
forming a patch panel by using the processor, wherein said forming the patch panel comprises:
forming the patch panel by connecting at least two components of the plurality of components with an interconnect, wherein the at least two components of the plurality of components include the master component and the slave component, wherein all ends of the interconnect are only on one side of the patch panel; and
forming a node of the patch panel, wherein the node is represented as a closed connection between the plurality of ports or a possible connection between the plurality of ports;
displaying the patch panel; and
displaying the master component and the slave component only on one side of the patch panel.

11. A non-transitory computer-readable medium in accordance with claim 10, wherein the method further comprises displaying, the plurality of ports only on one side of the patch panel.

12. A non-transitory computer-readable medium in accordance with claim 10, wherein displaying the master component and the slave component only on one side comprises displaying the master component and the slave component along a plurality of rows.

13. A non-transitory computer-readable medium in accordance with claim 10, wherein displaying the master component and the slave component only on one side comprises displaying the master component and the slave component as vertically aligned along a plurality of rows.

14. A non-transitory computer-readable medium in accordance with claim 10, wherein the method further comprises connecting the master port with the slave port via a single-looped interconnect of the patch panel, wherein the single-looped interconnect includes the node.

15. A non-transitory computer-readable medium in accordance with claim 10, wherein the method further comprises connecting the master port to a plurality of slave ports via a multi-looped interconnect, wherein the multi-looped interconnect includes the node.

16. A non-transitory computer-readable medium in accordance with claim 10, wherein the node is represented as the possible connection in a first state and as the closed connection in a second state.

17. A system comprising:
a display device configurable to display a plurality of components for implementing the digital design on a programmable chip, wherein the plurality of components include a master component and a slave component, wherein the slave component responds to the master component, wherein the plurality of components includes a plurality of ports including a master port and a slave port, wherein the master port is connected to the slave port; and
a processor configurable to form a patch panel by:
connecting at least two components of the plurality of components with an interconnect, wherein the at least two components of the plurality of components include the master component and the slave component, wherein all ends of the interconnect are only on one side of the patch panel; and
forming a node of the patch panel, wherein the node is represented as a closed connection between the plurality of ports or a possible connection between the plurality of ports,
wherein the display device is configurable to display the patch panel, wherein the display device is configurable to display the master component and the slave component only on one side of the patch panel.

18. A system in accordance with claim 17, wherein the display device is configurable to display the plurality of ports only on one side of the patch panel.

19. A system in accordance with claim 17, wherein the display device is configurable to display the master component and the slave component along a plurality of rows.

20. A system in accordance with claim 17, wherein the display device is configurable to display the master component and the slave component as vertically aligned along a plurality of rows.

21. A system in accordance with claim 17, wherein the master port is connected with the slave port via a single-looped interconnect of the patch panel, wherein the single-looped interconnect includes the node.

22. A system in accordance with claim 17, wherein the master port is connected to a plurality of slave ports via a multi-looped interconnect, wherein the multi-looped interconnect includes the node.

23. A system in accordance with claim 17, wherein the node is represented as the possible connection in a first state and as the closed connection in a second state.

24. The method of claim 1, wherein displaying, via the display device, the master component and the slave component only on one side of the patch panel further comprises:
displaying the master component and the slave component only on a first side of the patch panel; and
displaying connection information identifying a connection between the master component and the slave component only on a second side of the patch panel.

25. The method of claim 1 further comprising:
displaying, via the display device, a plurality of master components and a plurality of slave components only on one side of the patch panel.

* * * * *